United States Patent [19]

Goss et al.

[11] Patent Number: 5,392,629

[45] Date of Patent: Feb. 28, 1995

[54] METHOD AND APPARATUS FOR FORMING MULTI-LEVEL FEATURES IN AN OBJECT

[75] Inventors: Donald C. Goss, Playa del Rey; Craig A. Rathkamp, Lake View Terrace, both of Calif.

[73] Assignee: Canoga Industries Inc., San Diego, Calif.

[21] Appl. No.: 143,083

[22] Filed: Oct. 26, 1993

[51] Int. Cl.⁶ .............................................. B21D 28/10
[52] U.S. Cl. .................................... 72/326; 72/379.2; 29/6.1; 29/163.6
[58] Field of Search .............. 72/326, 325, 414, 379.2, 72/472; 29/6.1, 163.6, 160

[56] References Cited

U.S. PATENT DOCUMENTS

| | | | |
|---|---|---|---|
| 132,386 | 10/1872 | Coover | 72/472 |
| 493,791 | 3/1893 | Schurig | 72/326 |
| 1,837,720 | 12/1931 | Luce | 72/379.2 |
| 3,287,873 | 11/1966 | McDill | 29/6.1 |
| 4,444,037 | 4/1984 | Norgate | 72/414 |
| 4,510,786 | 4/1985 | Strangward | 72/326 |
| 4,748,841 | 6/1988 | Mezger | 72/326 |

FOREIGN PATENT DOCUMENTS

| | | | |
|---|---|---|---|
| 508477 | 9/1930 | Germany | 72/326 |
| 739437 | 9/1943 | Germany | 72/414 |
| 2137260 | 10/1972 | Germany | 72/472 |
| 40025 | 10/1972 | Japan | 72/379.2 |

OTHER PUBLICATIONS

Institute of Electrical and Electronics Engineers, Inc. "IEEE Standard for Mechanical Core Specifications for Microcomputers Using IEC 603-2 Connectors", IEEE Std 1101.1-1991 pp. 44-45 (Jun. 18, 1992).

Primary Examiner—Daniel C. Crane

[57] ABSTRACT

An elevated card guide is integrally formed in a card cage in a process using a press, a sheet of raw material, and a tool for forming a plurality of features having at least three levels. In one embodiment, the card guide includes several multi-level bridges with at least three levels in each bridge. In another embodiment, a lead-in is formed in at least one end of at least one horizontal bridge in the multi-level bridges. Still another embodiment incorporates at least one landing in at least one of the horizontal bridges. Lead-ins and landings may also be incorporated into one or more multi-level bridges. The tool includes a male portion and a female portion which cooperate simultaneously. The tool is able to accurately dimension a part in total compliance with required specifications and all printed circuit board designs. A method of forming a plurality of multi-level features uses the press, the sheet, and the tool to form complete features in a single stroke step using the single tool. Activating the press energizes a ram which presses the tool simultaneously into the sheet. After the ram is retracted, the sheet is relocated to another pre-established position which allows room on the card guide for associated components to be connected to the guide. The process is then repeated as necessary. The apparatus and method are readily adapted to many devices of different designs.

14 Claims, 3 Drawing Sheets

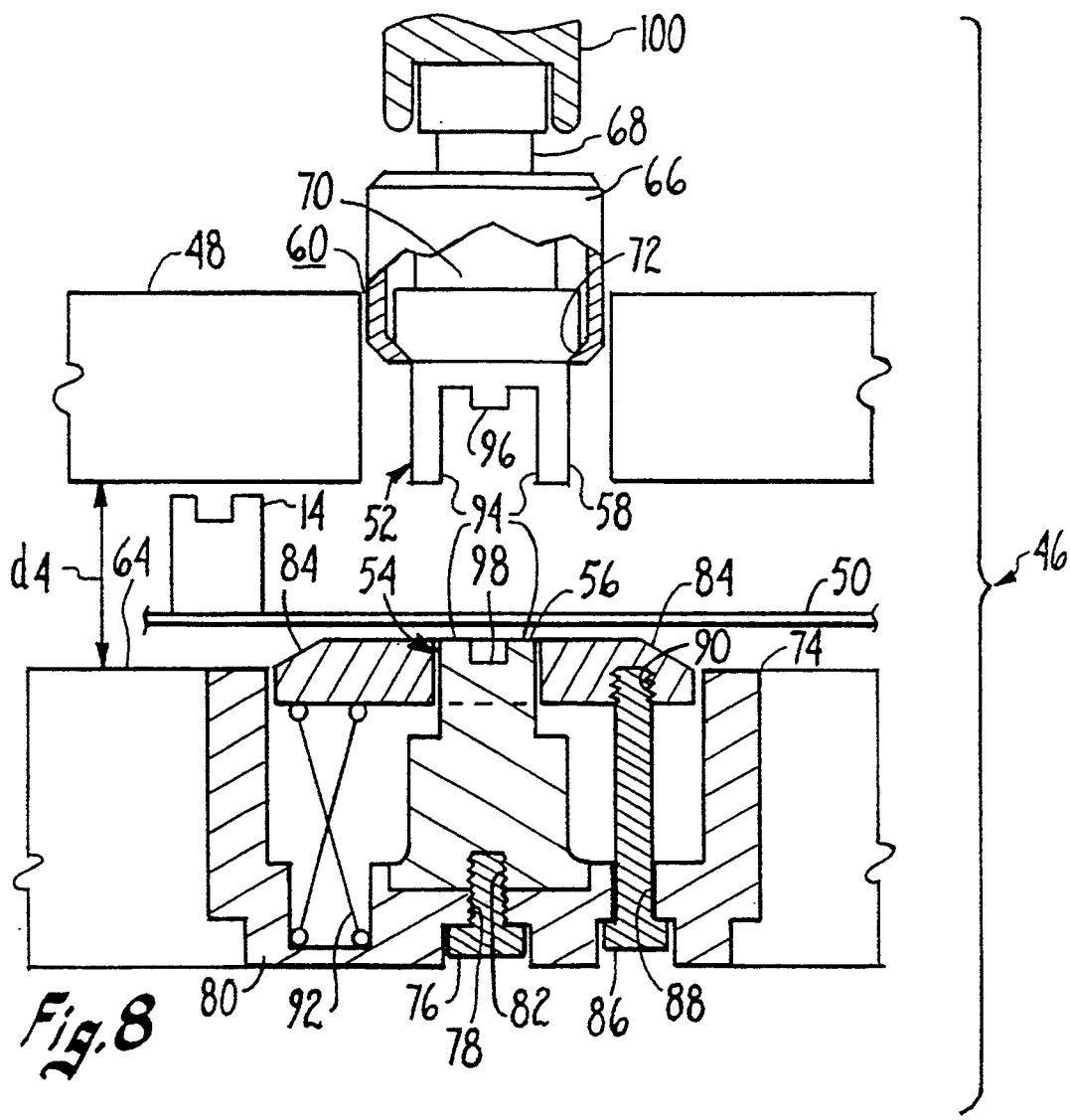
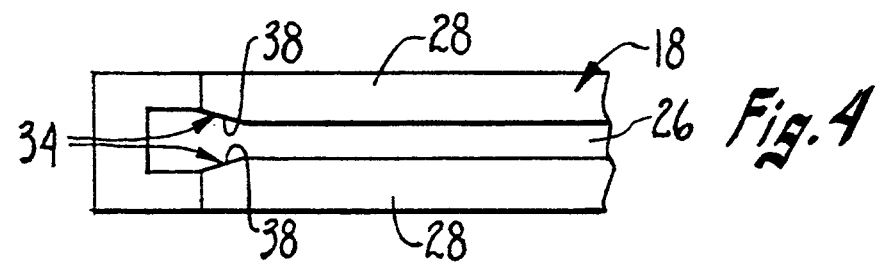
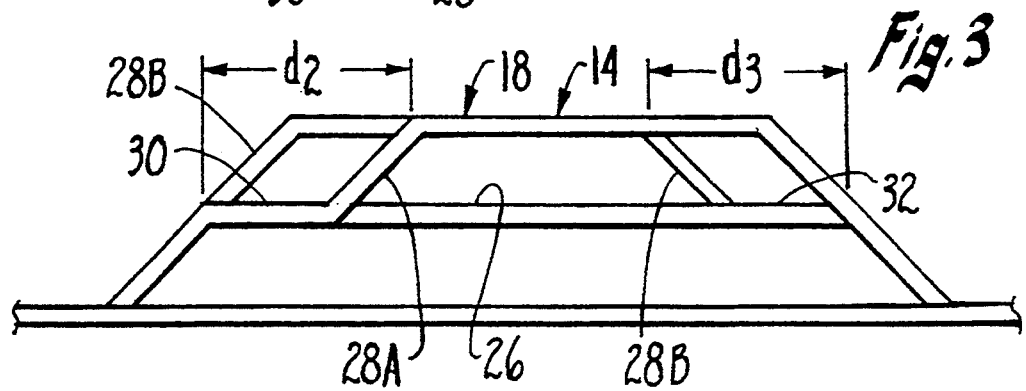

METHOD AND APPARATUS FOR FORMING MULTI-LEVEL FEATURES IN AN OBJECT

BACKGROUND OF THE INVENTION

1. Field of the Invention

The field of technology of this invention is enclosures for retaining integrated circuit cards and related components and peripherals and, more specifically, card guides integrally incorporated into card cages and a method of manufacturing card guides and other multiple level devices in a single step operation using a single tool.

2. Description of the Related Art

Card cages may be used to support one or more printed circuit boards (PCB's) on elements generally referred to as card guides. In addition to supporting the PCB's, these card guides provide a path or track which serves to both permit the PCB to slide into and out of the card cage and to retain the PCB in a selected location in the card cage. Card guides may incorporate other features such as clamping mechanisms, electrical grounding, electrical isolation, heat sinking and shock absorption.

Printed circuit boards include electrical components attached to one or both sides thereof. Any given PCB can differ in thickness, width and length from another PCB, depending on its function, and manufacturer, and as defined by the components secured upon that board. A PCB can include multiple circuit boards which are secured adjacent to or in contact with each other. These boards typically have a base, main or primary board (lower board) and one or more secondary boards. These secondary boards (upper boards) are commonly referred to as piggyback or daughter boards. The piggyback boards may be wider or narrower than the primary board to which they are attached.

Card cages, referred to also as card files, are used to hold PCBs in an orderly and fixed position. The card guides, in turn, establish the distance or spacing between each PCB or multiple board configuration. Some industries have established standards for the PCB spacing, to tailor the design to match the specific design requirement for the application. In fact, the spacing need not be uniform from board to board, nor does a company always use standards, feeling that they must customize the design of the board spacing.

Interconnecting the PCBs is still another design requirement. At least two types of interconnection schemes are typical in the electronics industry for electrically connecting the components on the board to other components. One scheme uses a special PCB called variously a backplane (active or passive), back panel or motherboard, which connects to the PCB installed into a card cage. The backplane may function as an electronic bridge. In another scheme, the interconnecting bridge may be a wire, a cable or pin connectors. Still a third scheme for connecting components may use both a backplane and interconnecting wiring.

As is well known, card cages and guides are manufactured from many assorted materials, including metals or plastic. In addition, the card guides may be manufactured as separate items, and subsequently attached in some fashion to the card cage. Alternatively, the card guide may be formed from the same material as the card cage and made an integral part of the associated card cage. Further, when metal is the material of choice, the card guides typically take one of three forms: formed or form-up guides, opposing tab guides, or lanced or double bridge lanced card guides. When plastic is the material of manufacture, the guide styles are generally one of the following: snap-in plastic guide, component assembled cage with guide, or fully molded enclosure or card cage.

The field of electronic card guides is crowded, yet none appear to be designed with great adaptability for use in many applications. The design and manufacture of card guides is generally quite complicated, requiring many parts and processes.

In the prior art, many different card guides have been in use for years. Each of the different designs is generally intended for limited applications. As a result, guides which are integral to a card cage often are unable to physically receive all multiple PCB configurations. Another drawback of existing card guides is that as the variety and non-uniform spacing requirements between each PCB has increased, it has become impossible for some card guide designs to be used.

Still another problem with prior art card guides is that in many configurations, specifically, formed metal card guides, the guide forces the edge of the inserted PCB, or multiple PCB configurations, into physical contact with the wall of the card cage. Unfortunately, this situation requires other design considerations, such as: changes to minimize or reduce the associated added heat; modifications to reduce the heat sink flow path; and changes to prevent potential shorting situations. Yet another disadvantage exists with current card guides. As previously described, some PCBs are in multiple board configurations. Because of the large variety of designs of PCBs, manufacturers have chosen to ignore portions of the established industry standards and therefore their designs frequently do not accommodate the various PCB widths that may subsequently be available for inclusion in the card cage.

Methods for manufacturing the card guides have also been unable to provide systems which fully satisfy the needs of the changing technology. For example, previous methods of manufacturing card guides used with electronic systems have been unable to produce a device which is an integral portion of the card cage and which has more than two levels. In addition, other manufacturers have been unable to use computer numerically controlled (CNC) presses to produce parts that are in total compliance with industry established and published specifications. Other manufacturers use methods which sometimes ignore established specifications. Prior methods require multiple parts and multiple steps to create a card guide, thereby incurring higher inventory costs, higher scrap costs, and higher labor costs than the present invention. Prior art manufacturing devices have been designed to push metal in one direction only, which has prevented the production of multiple level card guides of three or more levels in a single tool production system. In contrast, the present invention permits pushing, or forming, the metal part in two directions simultaneously, in a single stroke, thereby reducing the number of steps in the process and concurrently reducing the cost of operation.

Therefore it is clear that a need still exists for a card guide which does provide for separation of the PCB away from the card cage walls; which can accommodate all thicknesses, widths, lengths and configurations of PCBs; which works for all board to board spacings, non-uniform, as well as uniform; works for all interconnecting systems; and complies with industry standards. It would also be an important improvement in the technology to provide a method of manufacturing such a card guide which is simple, fast and relatively inexpensive to use.

SUMMARY OF THE INVENTION

The above disadvantages and problems are overcome by the present invention, improving upon previous attempts to design and produce a PCB card guide or other electronic related devices. An apparatus and method for forming multi-level electronic related parts in a single step operation using a single tool are described hereinbelow.

The elevated PCB card guide may be formed by a process using a computer numerically controlled (CNC) press or punch press, a raw material sheet, and a tool having male and female portions. A variety of presses may be used to create the card guide or other related components or peripherals. The card guide includes at least one multi-level bridge of three or more levels. Each of the multi-level bridges are distanced from the next adjacent multi-level bridge. In one preferred embodiment of the present invention, each multi-level bridge has three levels. In a first embodiment, each multi-level bridge includes a first level base portion, a second level elevated portion, and a third level elevated portion. The first level base portion is at the level of the sheet of raw material. The second level elevated portion is a web centered along a lengthwise axis of the card guide, whereas the third level elevated portion includes a plurality of horizontal bridges. These bridges are parallel and contiguous to the web, whereas the plurality of bridges are elevated in height in relation to the web. However, the upper horizontal bridges, when compared to each other, do not have to be equal in height from the web. The horizontal bridges may be formed to have a lead-in at one end or both ends to facilitate insertion of a PCB. Another feature which may be incorporated, depending on the application, is a landing at one end of one of the horizontal bridges, or at opposite ends of two horizontal bridges. The landing, or landings, also may facilitate insertion of a PCB into the multi-level bridges.

A card guide and cage system, including a card cage, is integrally formed from the sheet of raw material. A printed circuit board, whose thickness dimension dictates corresponding dimensions of the card guide, can then be inserted into the card guide.

The tool is used for forming the multi-level electronically related parts. Both the male portion and the female portion of the tool cooperate simultaneously to shear and form a single complete part having at least three levels in a single operation. The two portions, preferably of steel, are sufficiently accurately dimensioned to form a part meeting pre-determined specifications. Both the male and female portions have at least three levels. The portions are fitted into separate tool holders and installed into opposing apertures within the punch press structure. Opposing each other and separated by a pre-determined distance, the matching portions include a punch in an upper portion of the tool and a lower portion of the tool. Tool holders are part of the CNC press. The pre-determined distance permits the tool to be installed within the press in the tool holders. In one possible configuration, the CNC press is a turret press.

At least one numerically controlled mechanically operated ram is aligned closely with the matching pair of tools. The ram may also be called a plunger. At least one sheet of raw material is provided to use in forming the plurality of features and is inserted between the matching pair of tools to a first pre-established position. The sheet is preferably steel, yet other materials, such as aluminum, may be acceptable for use in a card cage environment.

In use, the press is activated until an appropriate tool is positioned under the ram. The raw material sheet is precisely positioned so that the correct part of the metal is located under the positioned tool. The ram is then activated to force the male and female portions of the tool onto the sheet. In a single stroke operation, one of the features is completely formed, each one of the features having at least three levels. The ram is then retracted to the inactivated positions prior to forming another of the features. As the tool is removed, a stripper pushes the formed sheet, now a part, from the press, allowing the sheet to be repositioned for the next operation. The next step is repositioning the sheet to another pre-established position prior to forming another of tile features, where another pre-established position provides sufficient distance between each of the features to allow room for associated components, such as a daughterboard, to be connected to the features. The process is repeated until sufficient features are formed in the sheet of raw material.

In summary, the present invention provides numerous advantages over the prior art, including being adaptable to all PCB designs and standards, providing separation from the walls of the card cages, being relatively inexpensive to manufacture, and having a simple design. In addition, the present invention has the capability of manufacturing devices in total compliance with industry established specifications, providing significant cost reduction in the manufacturing process, producing an intermediate volume of devices, and being a flexible process that is readily adapted to many other devices of different designs.

These and other features and advantages of the present invention are set forth more completely in the accompanying drawings and the following description.

BRIEF DESCRIPTION OF THE DRAWINGS

Details of the invention, and of the preferred embodiments thereof, will be further understood upon reference to the drawings, wherein:

FIG. 3 is a side view of another embodiment of the card guide shown in FIG. 2, illustrating a landing feature incorporated into the design.

FIG. 4 is a top view of another embodiment of the card guide shown in FIG. 2, illustrating a lead-in feature incorporated into the design.

FIG. 8 is a side view in partial cross section of a tool, incorporated within the turret press illustrating the relationship between the tool, the raw material for creating a part using the tool, and the press.

DETAILED DESCRIPTION OF THE PREFERRED EMBODIMENTS

Figure 1:
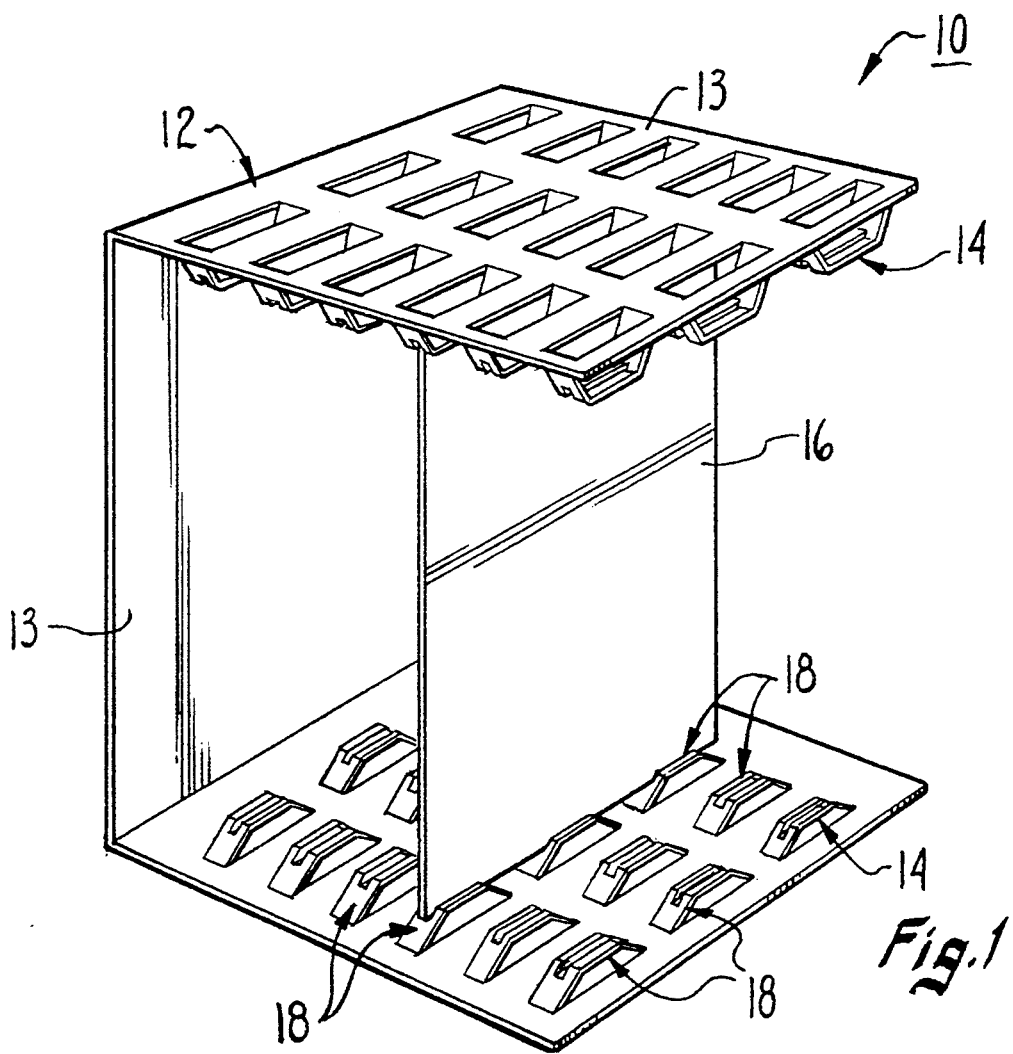
FIG. 1 is a perspective view of one presently preferred embodiment of the present invention, illustrating a card cage, card guide, and printed circuit board.

Referring initially to FIG. 1, a perspective view of a presently preferred embodiment is shown of an elevated card guide system 10. A card cage 12, having a plurality of walls 13, an elevated card guide 14 and a printed circuit board (PCB) 16 are illustrated as part of the card guide system 10. As is seen in FIG. 1, the card cage 12 and the elevated card guide 14 are illustrated as integrally formed as one part. Other configurations for incorporating a card guide 14 may be used, depending on the specific application. For instance, a card guide 14 may be in one sheet of material, or also in separate sheets of joined material. The card guide 14 includes a plurality of raised members such as a multi-level bridge 18 having slots therein for receiving and guiding the edge of the PCB 16. A representative PCB 16 is shown inserted into the card guide 14. The thickness dimension of the PCB 16, including the space occupied by electronic components secured on the face thereof, dictates corresponding dimensions for the card guide 14, which then allows the PCB 16 to be inserted into the card guide 14. The integral nature of the card guide 14 and the card cage 12 is advantageous in minimizing the steps of the production process over those required to manufacture prior art systems using separate parts.

Because of one-piece manufacturing flexibility, the single piece card guide 14 in the card cage 12 shown in FIG. 1 meets industry standards and virtually any known design requirements for different card guides, or even other electronic related devices. One example standard which is complied with in the present invention is IEEE 1101.1-1991 IEEE Standard for Mechanical Core Specifications for Microcomputers using IEC 603-2 Connectors. Another such standard complied with is IEEE 1301-1991, IEEE Standard for a Metric Equipment Practice for Microcomputers.

Figure 2:
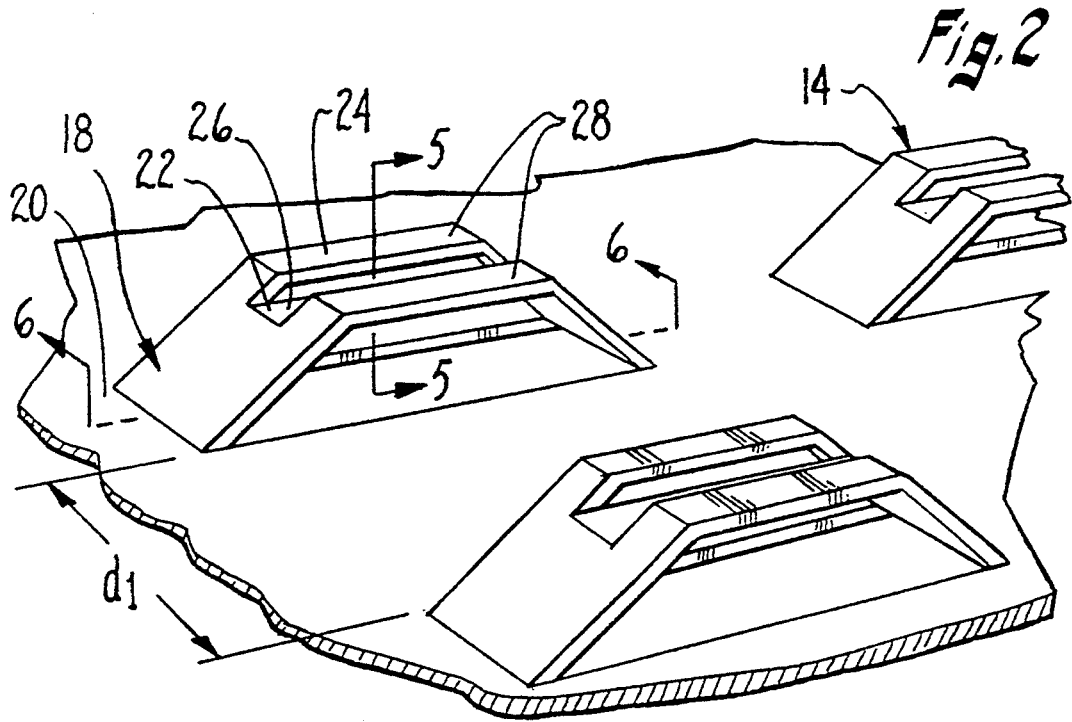
FIG. 2 is a perspective view of a first embodiment of the card guide shown in FIG. 1, illustrating the design structure.

Referring next to FIG. 2, one preferred embodiment of the elevated card guide 14 illustrates the design structure. The card guide 14 includes at least one multi-level bridge 18. Each of the multi-level bridges 18 are separated by some finite distance from the next adjacent multi-level bridge 18, yet the multi-level bridges 18 are proximate to each other. The multi-level bridges 18 are arranged in rows and columns in the card guide 14, in an alignment to receive, guide and retain an adjacent edge of the PCB 16. Each multi-level bridge 18 includes a first level base portion 20, a second level elevated portion 22, and a third level elevated portion 24. The first level base portion 20 is at the same level or plane as the card cage 12, while the second level elevated portion 22 forms a web 26 centered along a lengthwise axis of the card guide 14. The third level elevated portion 24 includes at least one horizontal bridge 28. Preferably, there are two bridges 28 which are parallel and contiguous to the web 26. The bridges 28 are elevated to a height in relation to the web 26 and may be of different heights when compared to each other and in relation to the web 26. The heights of the respective horizontal bridges 28 are formed depending on the required application. Formation of an integral card guide 14 and a card cage 12 of this configuration has not previously been produced since tooling to do this was not available and it was felt that a tool design for producing this configuration would not work, and would be costly and complex, at best. In particular, tools which deform metal in more than one position leave the metal between the deformations at a base height. However, in the present invention, the metal between deformations is at an intermediate height comprising the second level portion 22.

FIG. 2 illustrates a separation distance $d_1$ between adjacent card guides 14. The adjustability of the separation distance $d_1$ in the product design phase is a valuable feature because the card cage 12 may be constructed so a daughterboard or other component may be easily attached to the PCB 16 which is inserted into the card guide 14 such that no contact is made between each PCB 16. Therefore, no possibility of component shorting exists, nor are other design requirements created which cause heat build up because of insufficient room for air circulation. Plus, a plurality of wide piggyback boards physically wider than the parent board contained within the card guides 14 may be used without binding between the piggyback boards.

Referring now to FIG. 3, a side view is shown of another preferred embodiment of the card guide 14. A first landing 30 is incorporated into one or more of the horizontal bridges 28. Depending on the design specification requirements, the first landing 30 facilitates the insertion of one or more PCBs 16 into each multi-level bridge 18 of the card guide 14. The first landing 30 or any similar landing is a portion of the multi-level bridge 18 which is at the same elevated level as the web 26. As seen in FIG. 3, the first landing 30 is in a horizontal or flat plane. The purpose of the first landing 30 is to make it easier for a person to align a PCB 16 into the multi-level bridges 18. In certain assembly configurations, it may be required to horizontally insert a PCB 16 from one side without being able to visually see the multi-level bridges 18. For instance, the card cage 12 may be oriented such that the multi-level bridges 18 are projecting horizontally, as opposed to projecting vertically from the web 26. In this orientation of the card cage 12, an assembler may begin inserting the PCB 16 horizontally into two opposing elevated card guides 14. When the PCB 16 simultaneously contacts an end of a first horizontal bridge 28A on each of the two opposing card guides 14, the assembler may allow the PCB 16 to drop onto a second horizontal bridge 28B on each card guide 14. At this point, the assembler knows he has aligned the PCB 16 with the horizontal bridges 28 and may continue horizontally inserting the PCB 16 further into the elevated card guides 14 within the card cage 12.

In another assembly configuration, it may be required to vertically insert the PCB 16 into the multi-level bridges 18. For example, the card cage 12 may be oriented such that the multi-level bridges 18 are projecting vertically from the web 26. In this orientation of the card cage 12, an assembler may begin inserting the PCB 16 into the elevated card guides 14. In this example, the assembler holds the PCB 16 vertically, yet moves the PCB 16 sideways passing over a landing 30 on each opposing card guide 14 until the PCB 16 contacts a horizontal bridge 28B on each card guide 14. At this point, the assembler knows he has aligned the PCB 16 with the horizontal bridges 28 and may continue vertically inserting the PCB 16 further into the card guides 14 within the card cage 12.

At least one first landing 30 may be formed in at least one end of each horizontal bridge 28, thereby facilitating the insertion of a PCB 16 into the elevated card guide 14. Just one possible embodiment is illustrated in FIG. 3. A first landing 30 is at one end of the first horizontal bridge 28A, while a second landing 32 may be at the opposite end of the second horizontal bridge 28B in the same multi-level bridge 18. The first landing 30 may be inset a first inset distance $d_2$, while the second landing 32 may be inset a second inset distance $d_3$.

Another embodiment (not shown) is having both the first landing 30 and the second landing 32 at opposite ends of the first horizontal bridge 28A. Still a third embodiment is having only the first landing 30 in one end of the first horizontal bridge 28A. Other embodiments may be used depending on the particular application requirements.

Referring now to FIG. 4, a top view of another embodiment is shown of the card guide 14. A lead-in 34 is incorporated into one or more of the horizontal bridges 28. In a similar manner as hereinbefore described in FIG. 3, the lead-in 34 may facilitate insertion of at least one of the PCBs 16, particularly if visibility is restricted to the person inserting the PCB 16. In one possible configuration, the lead-in 34 is a cut-away portion of each of the horizontal bridges 28 at one of two ends 36 of the multi-level bridge 18. As shown in FIG. 4, the lead-in 34 has two slanted faces 38 created in the horizontal bridges 28. The purpose of the lead-in 34 is to make it easier for a person to slide a PCB 16 into the multi-level bridge 18. In certain assembly configurations, it may be necessary to slide a PCB 16 into the multi-level bridge 18 without easily seeing the bridge 18. Therefore, the assembler only needs to contact one or the other slanted face 38 with the PCB 16 to know that he may continue inserting the PCB 16 into the multi-level bridge 18. Depending also on the specification requirements, the lead-in 34 may be at one end 36 of the multi-level bridge 18 or another end, or even at both ends.

Figure 5:
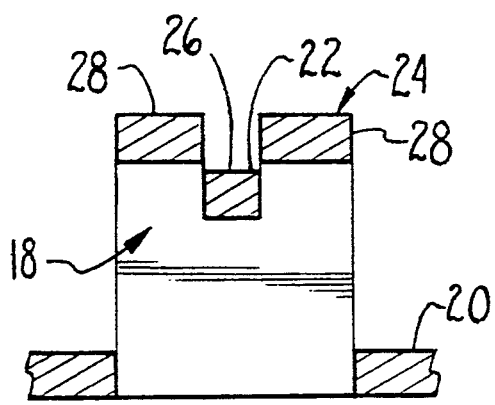
FIG. 5 is an end sectional view of a portion of one of the card guides, taken along line 5—5 of FIG. 2.

Referring now to FIG. 5, a cross sectional end view is shown of a portion of the card guide 14. The section view shown in FIG. 5 is taken along line 5—5 in FIG. 2. The end view is the one typically seen by a person inserting the PCB 16. The first level base portion 20, the second level elevated portion 22, and the third level elevated portion 24 are all shown. Also shown are the two horizontal bridges 28 which hold the PCB 16 while the PCB 16 rests on the web 26 of the second level elevated portion 22. The web 26 is unique in the art because heretofore no manufacturer was able to make such a web 26 in the card guide 14. Previously, in punching a card guide 14, only two levels have been incorporated into a multi-level bridge 18 for a card guide 14.

Figure 6:
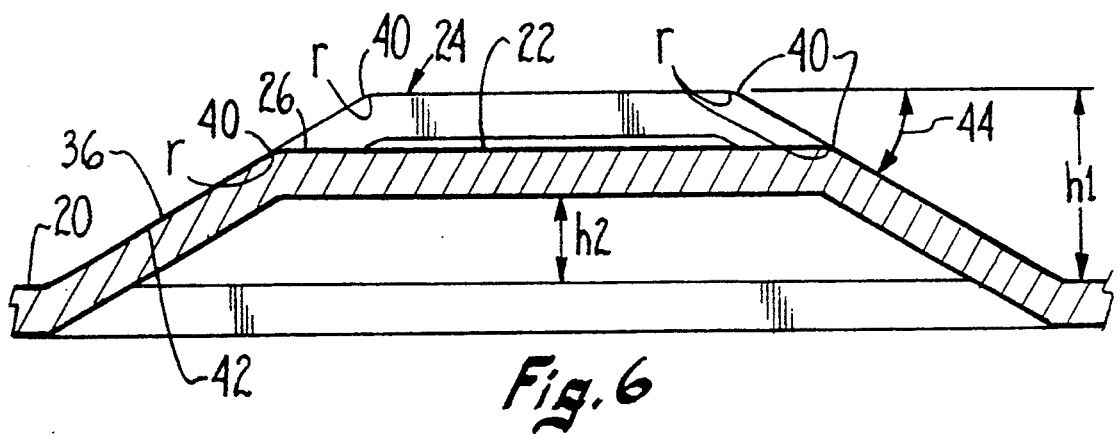
FIG. 6 is a right side sectional view of a portion of one of the card guides, taken along line 6—6 of FIG. 2.

Referring next to FIG. 6, a cross sectional right side view of the first embodiment is shown taken along line 6-6 in FIG. 2. The second level elevated portion 22 of the card guide 14 is seen in section. In addition, at least one rounded corner 40 is provided in the multi-level bridge 18. The rounded corners 40 are at each location where bends occur in the multi-level bridge 18. Each radius r of each corner 40 is independently variable depending on a particular application or material used. A height $h_1$ of the card guide 14 is noteworthy, since, in at least one application, it is attainable at about 0.31 inches complying with IEEE 1101.1-1991. Previous methods and apparatus for manufacturing electronic related devices have been unable to form a device, such as the card guide 14, with the height $h_1$ provided in the illustrated embodiment of the present invention. The height $h_1$ provides additional separation between components to allow the card guide 14 to be in compliance with certain standards and design requirements that previously have been unmet or were ignored because of cost considerations. For each material of choice and each thickness of choice, or a combination thereof, an empirical relationship exists with the height $h_1$ of the feature, such as in the card guide 14. The relationship just described is critical to the success of forming features in materials such as steel.

Also preferably, a height $h_2$ of the web 26 is variable in elevation to comply with standard and non-standard specifications. An advantage of the separation distance $h_2$ is that no contact is made between the wall 13 (shown in FIG. 1) of the card cage 12 and the PCB 16. The open structure design of the card guide 14 in this embodiment provides additional circulation paths for air to aid in cooling or maintaining the necessary temperature environment for the particular electronic system using the card guide 14. A slanted face surface 42 on either of the two ends 36 of the multi-level bridges 18 in the card guide 14 facilitates insertion of the PCB 16, particularly when access and visibility may be restricted to an assembler, technician or engineer. An angle 44 of variable degree value from the horizontal is shown for the slanted face surfaces 42 of the multi-level bridges 18. The angle 44 provides one way to more easily insert a PCB 16 into the card guide 14.

Figure 7:
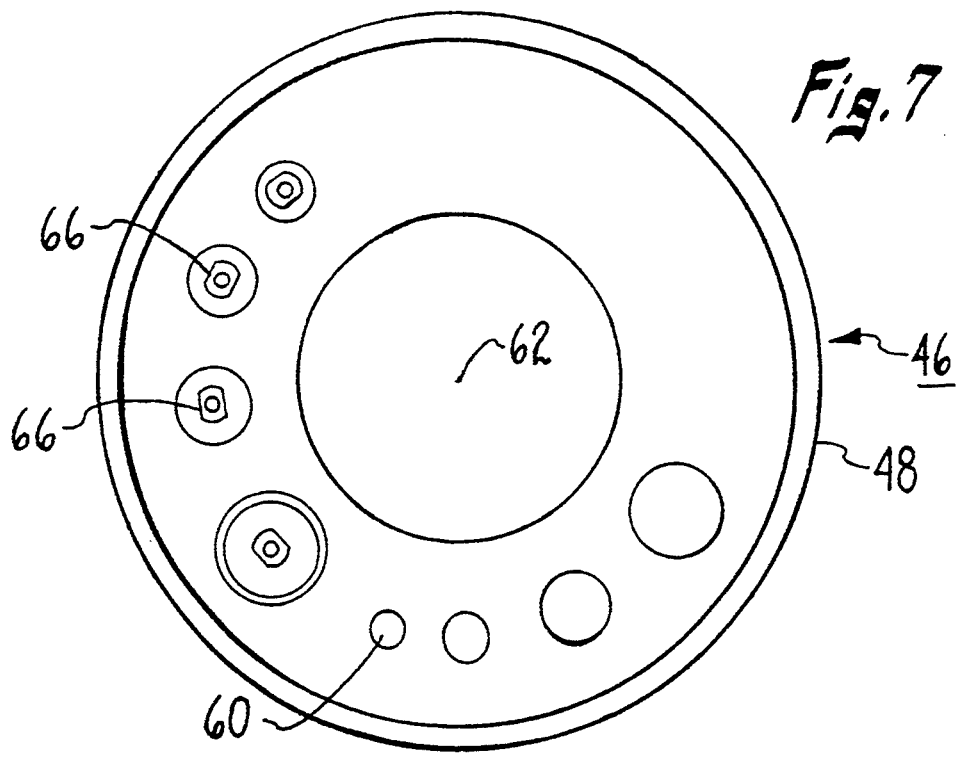
FIG. 7 is a plan view of a turret press illustrating numerous apertures for containing tools therein.

Referring now to FIG. 7, a plan view of a portion of a press 46 and designated as an upper turret 48 is shown. For the configuration shown, the upper turret 48 is of a computer numerically controlled (CNC) turret press machine. However, other CNC presses or other types of punch presses may also be used for forming features of the preferred embodiment in the card guide 14 or other related components and peripherals. Examples of such types of presses include semi-automatic fabricators, hydraulic-mechanical hybrid press brakes, straight side presses, and gap frame presses. The elevated card guide 14 is formed from a process using the CNC press 46, a raw material sheet 50 (also known as a blank), and an appropriate tool 52, 54 having a male 56 and a female portion 58 (The male and female portions 56, 58 are not shown in FIG. 7). The tool 52, 54 has an upper portion 52 and a lower portion 54, the upper portion 52 being the female portion 58, while the lower portion 54 is the male portion 56. Numerous apertures (or stations) 60 are shown in a generally circular shape formed in the upper turret 48 of the press 46. However, as is known by one skilled in the art, the apertures 60 could be of any required shape for use in containing different shaped tool holders, such as for holding rotary tool holders, square tool holders, and other holders. A pivot point 62 is shown in the center of the upper turret 48 representative of the point about which the upper turret 48 rotates when energized. A matching lower turret 64 (not shown in FIG. 7 is underneath the illustrated upper turret 48. The second turret 64 is more clearly illustrated in FIG. 8.

Referring next to FIG. 8, a detail side view in partial cross section of the tool 52, 54 is illustrated inserted into the press 46, illustrating the relationship between the tool 52, 54, the raw material sheet 50 used for creating a part, and the press 46.

As was generally described previously with respect to FIG. 7, the press 46 includes the first and second matching turrets 48, 64 in an upper and lower relationship. FIG. 8 illustrates the second matching turret 64. The two turrets 48, 64 are separated by a second separation distance $d_4$ which permits the tool 52, 54 to be fitted between the two turrets 48, 64 preferably formed of tool steel. The press 46 may be obtained from manufacturers such as Murata Wiedemann, Inc. of Charlotte, N.C., Strippit, Inc. of Akron, N.Y., or Trumpf, Inc. of Farmington, Conn.

The upper portion 52 of the tool 52, 54 is secured within the aperture 60 using a tool holder 66 by preferably removing a punch holder 68 and installing the upper portion 52 within the tool holder 66. The tool holder 66 has a punch 70 extending downward and abutting the top of the upper portion 52. When the punch holder 68 is secured to the tool holder 66, the upper portion 52 is formed downwardly against a beveled aperture edge 72, whereas the lower portion 54 of the tool 52, 54 extends below the edge 72 to define the female portion 58. The punch 70 may be secured within the tool holder 66 by any conventional means such as threads mating with threads on the inner walls of the punch 70.

Continuing with FIG. 8, the lower portion 54, which is mateable with the female portion 58, is secured within a lower turret aperture 74 of the press 46 by means of a retaining device 76, such as a bolt or clamp, varying by manufacturer, to the lower turret 64. In FIG. 8, the retaining device 76 is a threaded bolt extending through a first threaded aperture 78 in a bottom die 80 of the lower turret 64. The male portion 56 is retained within the bottom die 80 by the retaining device 76 and into a second threaded aperture 82 in the base of the male portion 56.

Lateral movement of the lower portion 54 is prevented within the lower turret aperture 74 by a preferably circular stripper plate 84 which is adjustably limited in vertical movement by a stripper bolt 86 extending through a sleeve aperture 88 in the base of the bottom die 80, and into threaded engagement with a hole 90 in the base of the stripper plate 84. The stripper plate 84 is adjustably positioned by a spring 92 extending from the base of the bottom die 80 to the underside of the stripper plate 84. In other words, when pressure is applied to the stripper plate 84 the spring 92 compresses and the plate 84 moves downward. When pressure on the stripper plate 84 is released, the spring 92 extends pushing the plate 84 in an upward direction.

Continuing with FIG. 8, forming the multi-level bridges 18 of the elevated card guide 14 is accomplished using the tool 52, 54. The female portion 58 has two outward blades 94 and a raised blade 96 within, forming a groove, while the male portion 56 includes the two outward blades 94 which intrude into the female portion 58 and includes the raised blade 96 received in a groove 98 of the male portion 56.

As shown in FIG. 8, the raw material sheet 50, preferably of steel, is positioned between the male portion 56 and female portion 58, the sheet 50 comprising a portion of the elevated card guide 14 wherein the multi-level bridges 18 are to be formed. In operation, the male portion 56 and the female portion 58 are forced together by the press 46, with the sheet 50 sandwiched therebetween, so as to cooperate simultaneously to form a single multi-level bridge 18, having at least three levels, in a single operation. The two portions 56, 58 are sufficiently accurately dimensioned to form a feature meeting pre-determined specifications. A representative card guide 14 is shown at another location on the material 50 after being formed thereon.

At least one numerically controlled mechanically operated opposing ram 100 is aligned closely with the matching portion of the tool 52, 54. The ram 100 is located external to the upper turret 48 of the press 46.

Several steps are part of the method of manufacturing an elevated card guide apparatus as hereinabove described in FIGS. 1–8. In particular, the first step in the illustrated embodiment comprises providing a computer numerically controlled (CNC) press 46, wherein the press further includes two opposing turrets 48, 64, and a pivot point 62 in a center of each of the turrets 48, 64 which is rotated by the press 46. A numerically controlled mechanically operated opposing ram 100 is essentially aligned with the matching portions of the tool 52, 54 and external to the opposing turrets 48, 64.

The second step is to provide at least one raw material sheet 50 for use in forming the plurality of card guides 14, wherein the raw material sheet 50 is preferably a metal such as steel.

The third step is to provide the tool 52, 54 to make the features. The tool 52, 54 has a male 56 and a female portion 58, where the tool 52, 54 is fitted between the turrets 48, 64. The female portion 58 is fitted into the upper turret 48 while the male portion 56 is fitted into the lower turret 64. Both the male and female portions 56, 58 of the tool have a blade or tooth configuration defining at least three levels.

The turrets 48, 64 in the press 46 are set at a predetermined second separation $d_2$ distance apart, where the distance $d_2$ permits the tool 52, 54 to be fitted within the turrets 48, 64. Next, the tool 52, 54 is positioned within the turrets 48, 64. Next, the press 46 is activated allowing the turrets 48, 64 to be spun about the pivot point 62 until the appropriate tool 52, 54 is positioned under the ram 100.

The next step is to position the raw material sheet 50 so that the correct part of the sheet 50 is located in a pre-established position between the turrets 48, 64 which are fitted with the tool 52, 54.

Next is the step of activating the ram 100 from the inactivated position external to the turrets 48, 64.

The next step is to press the female upper portion 52 of the tool 52, 54 with the ram 100 into the raw material sheet 50, where in a single compression stroke one of the multi-level bridges 18 is completely formed, each one of the multi-level bridges 18 having at least three levels.

Next, the ram 100 is retracted to the inactivated position prior to forming another of the card guides 14.

In the next step, a stripper plate 84 is used to push the formed sheet 50, now a part, from the press 46, allowing the sheet 50 to be repositioned for the next operation. The next pre-determined position provides the separation distance $d_1$ between each of the card guides 14 to allow room for associated components, such as daughterboards, to be connected to the PCB 16.

The final step comprises repeating the process until sufficient card guides 14 are formed in the raw material sheet 50.

The method hereinabove described when used with the described apparatus is not only suitable for low volume production of card guides 14 and like electronic related devices, but for intermediate production volume as well. No need will continue to exist to design or buy hard tooling for a specific application. The present embodiments fully meet the need for most card cage production scenarios, particularly in light of the many and different designs required for specific applications in electronic systems. In addition, when standards or requirements must be tailored, the present invention permits easy adaptation by using tooling adaptable to a press and an electronic system to house various devices. Two particular materials, metal and plastic, have been mentioned. However, one skilled in the art will recognize that other materials are suitable depending on the application required.

In summary, the advantages of the present invention include being adaptable to all PCB designs and standards, providing separation from the walls of card cages, being relatively inexpensive to manufacture, and having a simple design. In addition, the present invention has the capability to manufacture devices to be in total compliance with called out specifications, providing significant cost reduction in the manufacturing process, producing intermediate volume of devices, and being a flexible process that is readily adapted to many other devices of different designs.

Not only does the present invention accommodate all PCB designs, but is also adaptable to other devices. For example, the present electronic card guide 14 is also adaptable for other steel sheet metal parts such as locators, dividers, and shear stops, or any electronic related part requiring shear and forming operations.

It can be seen that the present invention provides an electronic card guide 14 which provides for separation of the PCB 16 away from the walls 13 of the card cage 12, accommodates all thicknesses, widths, lengths and configurations of the PCB 16, and which works for all board to board spacings, non-uniform, as well as uniform, while still complying with industry standards. The tool designs required are readily adaptable for different applications.

The foregoing description of the invention is explanatory thereof and various changes in the size, shape, and materials, will be suggested to one skilled in the art, and may be made within the scope of the appended claims, without departing from the spirit of the invention. Therefore, the scope of the present invention is not limited to the embodiments described herein, but rather the scope of the present invention is defined by the claims.

What is claimed is:

1. A method of forming multi-level features in a device, comprising the steps of:
   providing a press for forming features in a device;
   inserting a tool into said press to use in forming said features;
   positioning a blank defining a plane in said press and adjacent said tool; and
   activating said press so as to press said tool against said blank, such that in a single compression stroke of said tool at least one of said features is formed and cut in said blank, wherein said at least one feature comprises at least three levels, and wherein a first of said three levels comprises said plane of said blank, and the other two of said three levels are located outwardly from said plane in a common direction.

2. The method as defined in claim 1, wherein said features are in devices for use in electrical and electronic systems.

3. The method as defined in claim 1, wherein said blank is metal..

4. The method as defined in claim 1, wherein said tool comprises at least a male portion and a female portion, and wherein each of said male and female portions comprises at least three levels.

5. The method as defined in claim 1, wherein said press is a turret press which comprises at least an upper turret and a lower turret.

6. The method as defined in claim 5, wherein a further step is positioning said upper turret and said lower turret at a predetermined distance apart, thereby allowing said tool to be inserted into said press.

7. The method as defined in claim 1, further comprising the steps of:
   repositioning said blank in said press, thereby providing sufficient distance between at least one of the subsequently formed said features for connecting at least one related component to said device; and
   repeating said single compression stroke of said tool, wherein at least another of said features is formed.

8. A tool for forming a plurality of multi-level features in a blank, said tool inserted into a press, wherein said tool comprises:
   a male portion; and
   a female portion manufactured to fit into said male portion, wherein said male portion and said female portion cooperate simultaneously to form a single complete feature in said blank inserted therebetween, said feature having at least three levels and being formed in a single compression stroke of said press, wherein a first of said three levels comprises said plane of said blank, and the other two of said three levels are located outwardly from said plane in a common direction, said tool being configured such that the plane of the blank, peripheral to the forming and cutting area is maintained during the compression stroke.

9. An apparatus for forming multi-level features in a device, comprising:
   a press for forming features in a device;
   at least one blank which defines a plane for use in said press for forming said features; and
   a tool fitted into said press for forming said and cutting said features in a single compression stroke, wherein said features comprise at least three levels and wherein a first of said three levels comprises said plane of said blank, and the other two of said three levels are located outwardly from said plane in a common direction, said tool being configured such that the plane of the blank peripheral to the forming and cutting area is maintained during the compression stroke.

10. The apparatus as defined in claim 9, wherein said features are in devices used in electrical and electronic systems.

11. The apparatus as defined in claim 9, wherein said blank is metal.

12. The apparatus as defined in claim 9, wherein said tool comprises at least a male portion and a female portion, wherein each of said male and female portions comprises at least three levels.

13. The apparatus as defined in claim 9, wherein said press is a turret press further comprising at least an upper turret and a lower turret.

14. The apparatus as defined in claim 13, wherein said upper turret and said lower turret are a predetermined distance apart, thereby allowing said tool to be inserted into said press.

* * * * *